US008472270B2

(12) United States Patent
Samuels et al.

(10) Patent No.: US 8,472,270 B2
(45) Date of Patent: Jun. 25, 2013

(54) APPARATUS AND METHOD FOR TESTING ONE-TIME-PROGRAMMABLE MEMORY

(75) Inventors: Howard R. Samuels, Newton, MA (US); Thomas W. Kelly, North Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 136 days.

(21) Appl. No.: 13/188,845

(22) Filed: Jul. 22, 2011

(65) Prior Publication Data

US 2012/0020139 A1    Jan. 26, 2012

Related U.S. Application Data

(60) Provisional application No. 61/367,223, filed on Jul. 23, 2010.

(51) Int. Cl.
G11C 7/00            (2006.01)

(52) U.S. Cl.
USPC ........................................ 365/201; 365/225.7

(58) Field of Classification Search
USPC .............................................. 365/201, 225.7
See application file for complete search history.

(56) References Cited

U.S. PATENT DOCUMENTS

| 4,718,042 | A | 1/1988 | Moll et al. | 365/201 |
| 4,809,231 | A | 2/1989 | Shannon et al. | 365/201 |
| 5,007,026 | A | 4/1991 | Gaultier et al. | 365/201 |
| 5,315,177 | A | 5/1994 | Zagar et al. | 307/465 |
| 6,249,457 | B1 | 6/2001 | Okamoto | 365/185.21 |
| 7,136,322 | B2 * | 11/2006 | Brennan et al. | 365/225.7 |
| 7,339,848 | B1 * | 3/2008 | Stansell et al. | 365/225.7 |
| 7,426,142 | B1 | 9/2008 | Stansell et al. | 365/185.21 |
| 7,843,747 | B2 | 11/2010 | Hsueh et al. | 365/201 |
| 2004/0239405 | A1 | 12/2004 | Mayer et al. | 327/525 |
| 2008/0238439 | A1 | 10/2008 | Lin et al. | 324/550 |
| 2009/0251943 | A1 | 10/2009 | Kurjanowicz | 365/96 |

OTHER PUBLICATIONS

International Searching Authority, International Search Report—International Application No. PCT/US2011/044998, dated Nov. 21, 2011, together with the Written Opinion of the International Searching Authority, 9 pages.

* cited by examiner

*Primary Examiner* — Son Dinh
(74) *Attorney, Agent, or Firm* — Sunstein Kann Murphy & Timbers LLP

(57) ABSTRACT

An apparatus and method of testing one-time-programmable memory limits current through a one-time-programmable memory to less than a threshold amplitude, where the memory has a fuse configured to blow upon receipt of a signal having the threshold amplitude. The method also uses blow signal assertion circuitry to attempt to assert a blow signal to the fuse. When not defective, blow signal assertion circuitry is configured to permit the low amplitude signal to flow through the fuse when the fuse is not blown and the blow signal is asserted. The method then produces an output signal having a success value if the limited current flows through the fuse, and a failure value if the current does not flow through the fuse.

17 Claims, 4 Drawing Sheets

APPARATUS AND METHOD FOR TESTING ONE-TIME-PROGRAMMABLE MEMORY

The present application claims priority from U.S. provisional application Ser. No. 61/367,223, filed Jul. 23, 2010, which is hereby incorporated herein by reference in its entirety.

TECHNICAL FIELD

The invention relates to testing one-time-programmable memory.

BACKGROUND ART

As its name suggests, one-time-programmable memory often includes a fuse that can be programmed one time only. Quite often, a user programs one-time-programmable memory well down the design chain; namely, after the memory is integrated into a larger system. Accordingly, if either the memory or its corresponding programming circuitry is defective, an entire system can malfunction. Specifically, while some of the surrounding logic may be tested at the factory before shipment, the actual function of programming the memory is not exercised until the memory is within a larger system.

SUMMARY OF VARIOUS EMBODIMENTS OF THE INVENTION

In accordance with one embodiment of the invention, an apparatus and method of testing one-time-programmable memory limits current flow through the one-time-programmable memory to a low amplitude signal, wherein the one-time-programmable memory has a fuse configured to blow upon receipt of a signal having a threshold amplitude. The low amplitude signal is less than the threshold amplitude. The method also uses blow circuitry to attempt to assert a blow signal to the fuse. When not defective, blow circuitry is configured to permit the low amplitude signal to flow through the fuse when the fuse is not blown and the blow signal is asserted. The fuse does not blow in response to flow of the low amplitude signal. The method then produces an output signal having a success value if the low amplitude signal flows through the fuse, and a failure value if the low amplitude signal does not flow through the fuse.

Limiting current flow through the one-time-programmable memory may involve imposing a high impedance between a voltage source and the memory. Whereas connection of the voltage source to the fuse without limiting current flow and with assertion of the blow signal when the blow signal assertion circuitry is not defective causes the fuse to blow, the current signal during testing can flow safely through the fuse. The current signal is less than the threshold current for blowing the fuse.

During testing, an output signal indicates success or failure. In various embodiments, the output signal has the failure value if the blow circuitry cannot assert the blow signal to the fuse. In addition, the output signal may have the failure value if the fuse (already) is blown. When the fuse is intact and conducts a current, a success value is indicated by the output signal. In a particular embodiment, the output circuit detects a voltage at a fuse supply to the fuse.

In accordance with various embodiments, asserting a blow signal, when the blow signal assertion circuitry is not defective, substitutes a low impedance for a high impedance in series with the fuse. Thus current may flow through the fuse. Upon connection of the fuse to a voltage source and substitution of the low impedance for the high impedance in series with the fuse, the fuse is expected to blow.

In accordance with an embodiment of a test circuit for testing a one-time-programmable memory, a fuse supply is connected to a fuse. A low impedance path is connected to the fuse supply and is capable of providing more than a threshold current to blow the fuse. A high impedance path is connected to the fuse supply for providing a current limited to less than the threshold current. In particular embodiments, the low impedance path and the high impedance path are connected in parallel between a rail voltage and the fuse supply. A switch in the low impedance path may be controlled to allow current flow in the low impedance path to the fuse supply for reading or blowing a fuse and to prevent current flow in the low impedance path during testing. The test circuit of the embodiment may also include a switch in the high impedance path so as to allow current to flow in the high impedance path for testing the fuse.

In order to indicate test results, the test circuit may include an output circuit connected to the fuse supply for providing an output signal. During testing with current flowing through the high impedance path, the output signal has a success value if current flows through the fuse and has a failure value if current does not flow through the fuse. More particularly, the output circuit may be an inverter. In addition, the test circuit may include a logic gate connected to the fuse supply for tying the fuse supply to ground when the switch in the high impedance path and the switch in the low impedance path are both preventing current flow.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Illustrative embodiments of the invention test one-time-programmable memory to determine if its programming circuitry, fuse(s), or both are functioning properly. To that end, a memory tester limits current to the fuse within a one-time-programmable memory module to a low amplitude current signal. The amplitude of this current signal is sufficiently low not to blow the fuse.

If the current signal successfully transmits through the fuse, then the memory tester delivers an output signal indicating that the programming circuitry and fuse are functioning properly. Conversely, if the current signal does not successfully transmit through the fuse, then the memory tester delivers an output signal indicating that the program circuitry, fuse, or both are not functioning properly. Details of illustrative embodiments are discussed below.

Figure 1:
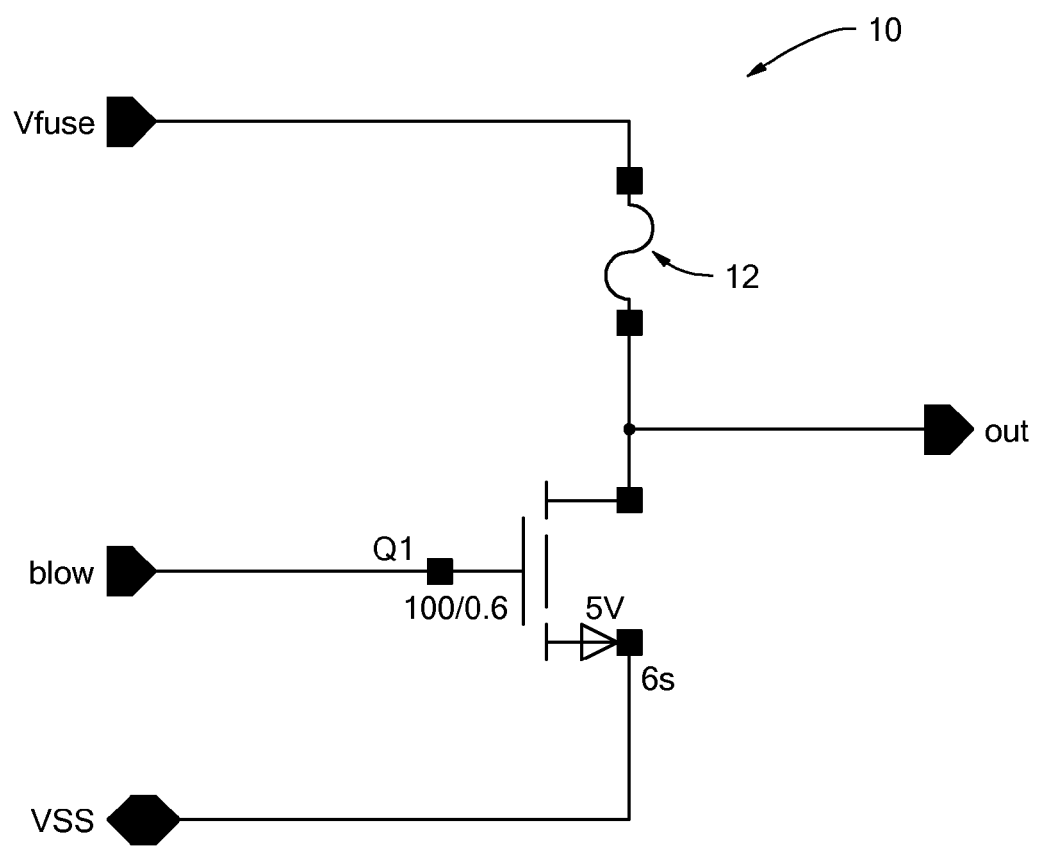
FIG. 1 schematically shows a one-time-programmable memory circuit that may be used with illustrative embodiments of the invention.

FIG. 1 schematically shows a one-time-programmable memory circuit 10 that may be used with illustrative embodiments of the invention. As known by those skilled in the art, one-time-programmable memory circuit 10 typically is used to store data in a reliable manner.

The circuit of FIG. 1 thus has a fuse 12 with one side coupled to a fuse supply port for receiving a fuse voltage (identified in the figures as "Vfuse"), and another side coupled to a blow transistor Q1 and low side power source Vss. To blow the fuse 12, a blow signal is applied to the gate of blow transistor Q1, causing Q1 to close the circuit between the fuse 12 and the low side power supply. In closing the circuit, transistor Q1 substitutes a low impedance for a high impedance between the fuse 12 and ground, i.e., the low side power source Vss. Accordingly, when the circuit is closed, a sufficiently high current applied to the Vfuse port passes through the fuse 12 and to Vss through the blow transistor Q1, blowing the fuse 12.

To determine if the fuse 12 has blown, downstream circuitry (shown in subsequent figures as a "read amplifier") draws a small current from an output port between the blow transistor and the fuse 12. Using this current, the read amplifier compares the voltage across the fuse 12 to a reference resistor. The value of the reference resistor is larger than that of the fuse 12 if the fuse 12 is not blown. Conversely, the value of the reference resistor is smaller than that of the fuse 12 if the fuse 12 is blown. This comparison thus explicitly indicates whether or not the fuse 12 is blown.

Various embodiments can use a number of different types of fuses. For example, some embodiments use a polysilicon thermal rupture fuse. Specifically, as known in the art, such a fuse typically is formed from polysilicon doped to lower its sheet resistance. This fuse operates much in the way a conventional electrical fuse does. Specifically, when a large amount of current passes through it, the fuse blows (i.e., it ruptures).

As a second example, the fuse may use electromigration as its programming method. More particularly, typically another material at a lower sheet resistance, such as cobalt silicide, is deposited on top of undoped polysilicon. A moderate, controlled amount of current is applied to the fuse, most of which flows through this cobalt silicide. Momentum of the electrons in the current flow is transferred to the cobalt silicide molecules, eventually causing molecules to migrate toward one end of the fuse. When enough molecules have moved, the resistance of the fuse increases substantially. This process is known as electromigration. Undoped polysilicon commonly is used as the base layer since its sheet resistance is higher than doped polysilicon. This results in a larger difference in resistance between a fuse that has been programmed, and another that has not been programmed.

Figure 2:
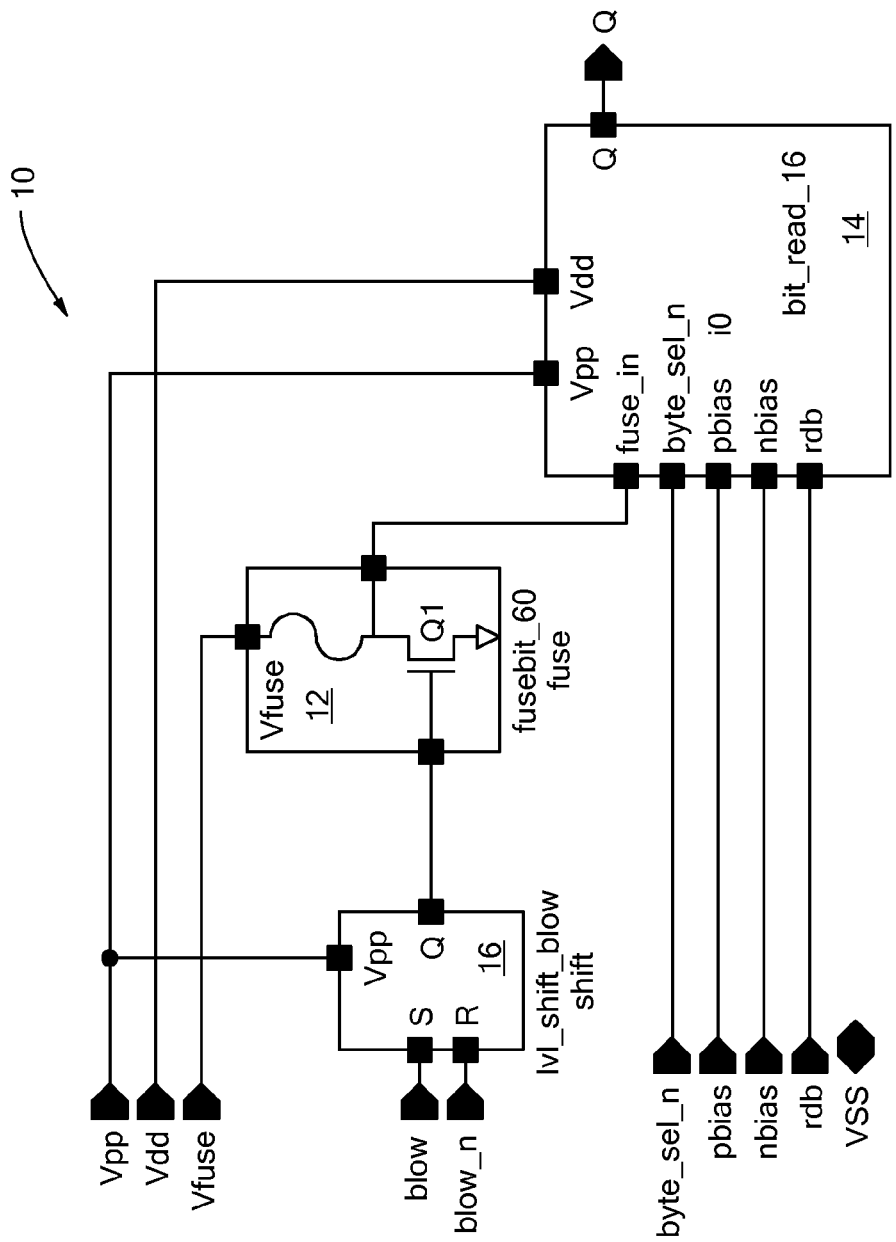
FIG. 2 schematically shows additional details of the circuit of FIG. 1.

FIG. 2 schematically shows more details of the circuit of FIG. 1. Specifically, in addition to showing the fuse 12, FIG. 2 also shows blow circuitry 16 that receives a precursor to the blow signal from upstream (related) circuitry, and generates an appropriate input to the gate of the blow transistor Q1. Among other things, blow signal assertion circuitry can include the blow circuitry 16, level shifting functionality and the blow transistor Q1. If the blow signal assertion circuitry is not defective, when it tries to assert a blow signal to the fuse, the blow signal is applied to the gate of blow transistor Q1, causing Q1 to substitute a low impedance for the high impedance between the fuse 12 and the low side power supply. FIG. 2 also shows a read amplifier 14, noted above, which determines if the fuse 12 has been blown. As shown, the read amplifier 14 is connected to the output port of the fuse 12.

Figure 3:
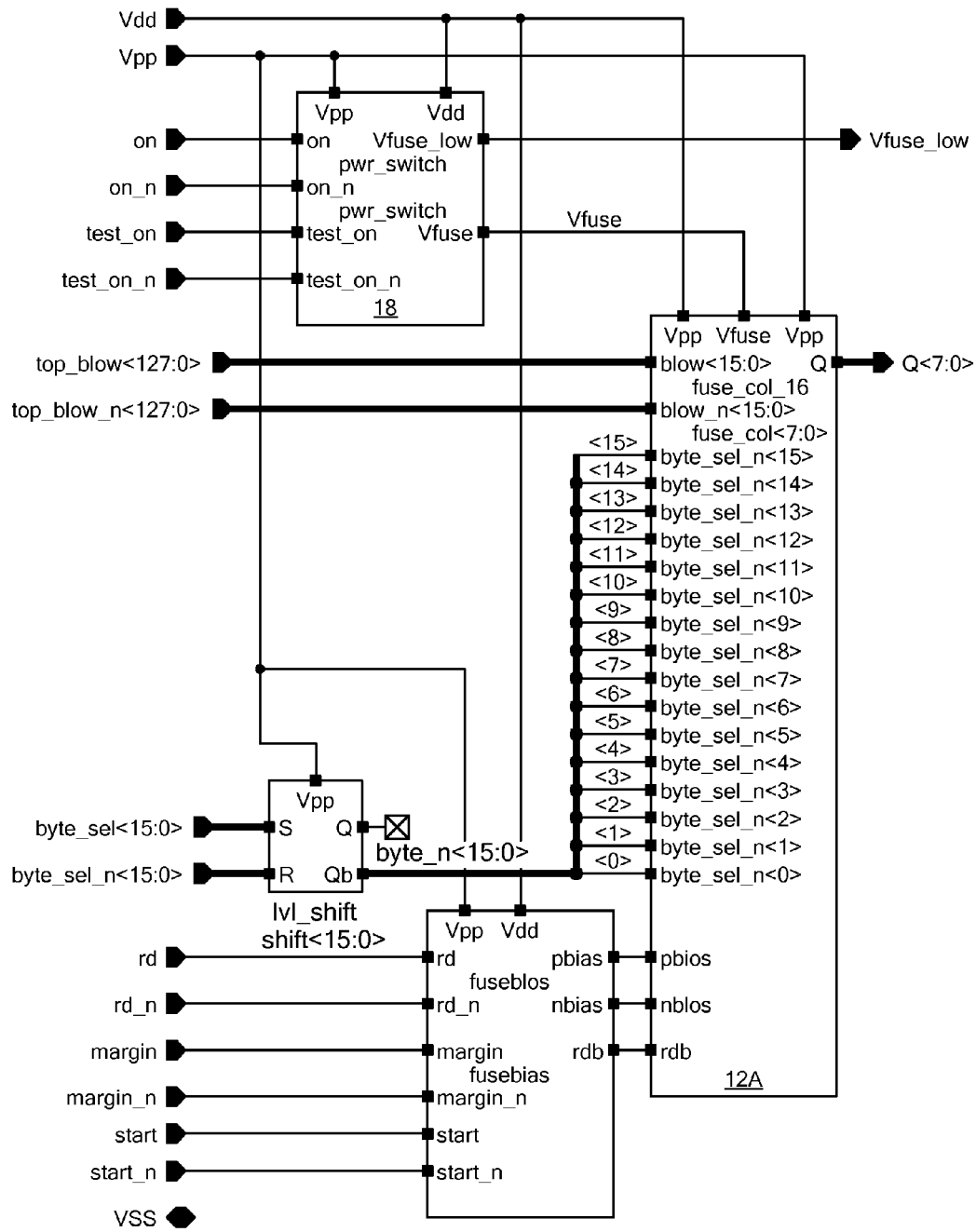
FIG. 3 schematically shows one-time-programmable memory integrated into a system implementing illustrative embodiments of the invention.

FIG. 3 schematically shows illustrative embodiments of the invention implemented within a system shown in FIGS. 1 and 2. In particular, FIG. 3 shows a fuse array 12A (also referred to as a "one-time-programmable memory module") which contains the circuit elements of FIG. 2 for acting upon each of the fuses 12 in the array. Thus, blow circuitry 16 and read amplifier 14 are integrated with the fuse array 12A. The read amplifier 14 detects which fuses 12, if any, have been programmed/blown. Thus, although discussed generally as used with a single fuse 12, various embodiments apply to arrays of fuses.

In accordance with illustrative embodiments of the invention, the circuit of FIG. 3 also has a fuse tester 18 coupled with the fuse array 12A. As shown in FIG. 3, the fuse tester 18 has input ports for implementing testing of fuses in the fuse array 12A, and a fuse supply (identified as "Vfuse," shown in FIGS. 1 and 2) for connecting the fuse array 12A with a high voltage rail Vpp. The fuse tester 18 also has a test output (identified as "Vfuse_low") for delivering a signal indicating the status of the blow signal assertion circuitry and fuses 12 during a test. When not conducting a test (e.g., when programming the fuse array 12A), the fuse tester 18 electrically connects the high voltage rail Vpp via a low impedance path through its fuse supply Vfuse and to the fuse array 12A. During a test, on the other hand, a high impedance path is substituted for the low impedance path. This substitutes a current limited to less than the threshold current for the low impedance connection to the high voltage rail.

Figure 4:
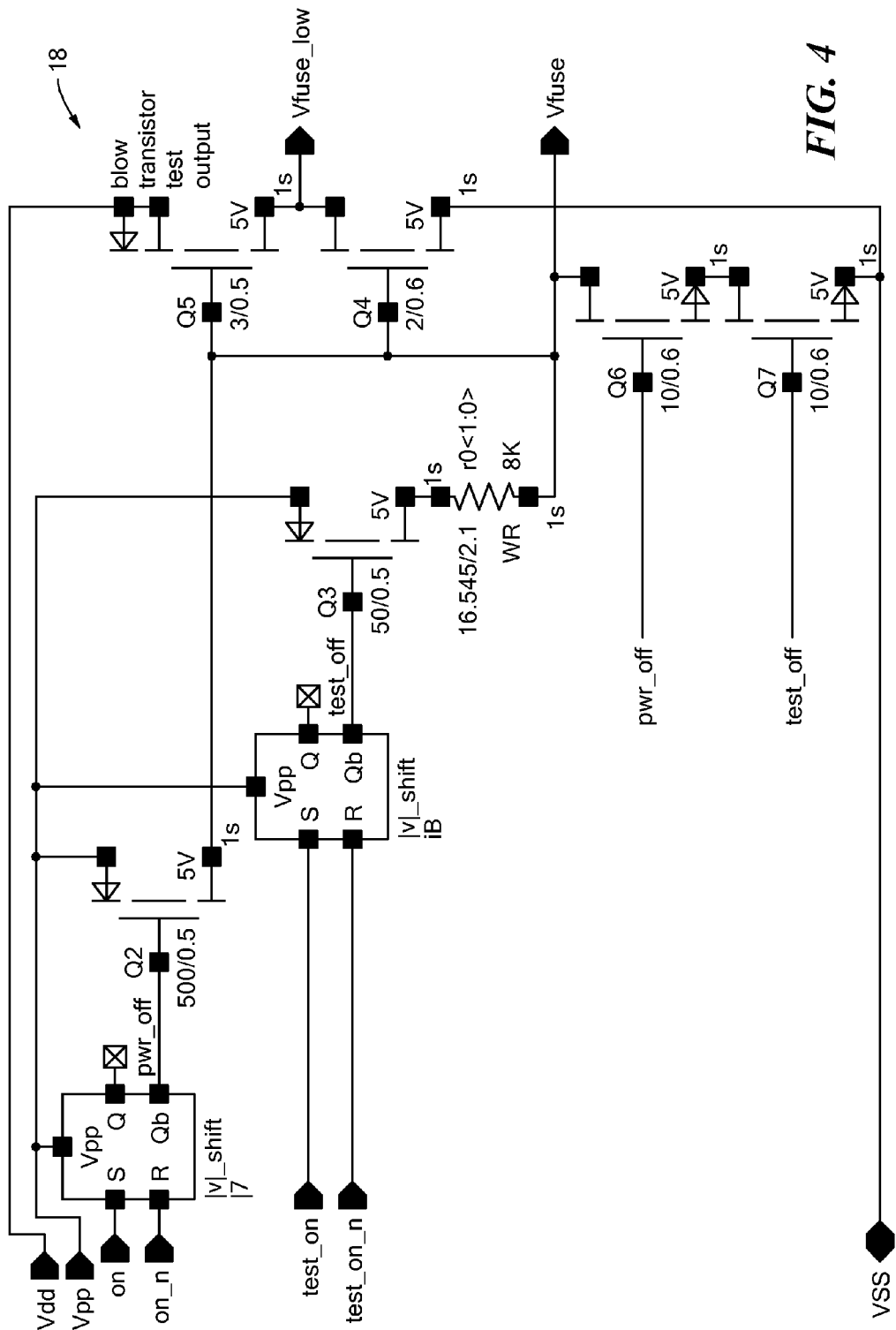
FIG. 4 schematically shows additional details of the memory tester shown in FIG. 3.

The fuse tester 18 is shown in greater detail in FIG. 4. In general, the fuse tester 18 can be programmed to either 1) connect the voltage rail Vpp to the fuse supply Vfuse via a low impedance circuit path, or 2) impose a high impedance, such as resistor R0, between the voltage rail Vpp and the fuse supply Vfuse. In other words, to accomplish the second option, the high impedance path is substituted for the low impedance path. R0 has a high enough resistance to limit the current to the fuse supply Vfuse to less than a threshold current, where the threshold current is that amplitude of current which would cause the fuse to blow. The threshold current may be more commonly known as the fuse blow/program threshold current.

As noted above, the fuse tester 18 limits current in the high impedance path to the fuse supply Vfuse when in a testing mode, and applies the high-voltage of the voltage rail Vpp through the low impedance path to the fuse supply Vfuse when programming the fuse(s). To those ends, the fuse tester 18 may be considered to have two modes:
  a test mode for testing the programming circuitry and fuses 12, and
  a programming mode for programming the fuses 12.

Illustrative embodiments execute these two modes at separate times. For example, a semiconductor manufacturer may run the test mode before shipping the product having the fuse(s) 12 and circuitry shown in the figures. An end-user or a downstream supplier, however, also may run the programming mode to program the fuses 12. Of course, the two modes can be run at any time in the supply chain, such as by a semiconductor manufacturer, a downstream supplier or system user.

When in the programming mode, a programming signal is applied to programming port (identified as "on"), which turns on a programming transistor Q2. The switch Q2 is in the low impedance path. Turning on Q2 enables the voltage rail Vpp to apply a high-voltage to the fuse supply Vfuse, which, as shown in FIG. 3, enables a user to selectively program the fuses 12 in the fuse array 12A. For any fuse at which a blow signal is asserted, the low impedance path will provide sufficient current from the voltage rail Vpp to blow the fuse.

Conversely, when in the test mode, a test signal applied to the test port (identified as "test_on_n") actuates a test transistor Q3. The switch Q3 is in the high impedance path. As noted above, illustrative embodiments do not apply the programming signal to the programming port at this time. Thus, for testing typically switch Q2 prevents current flow and Q3 allows current flow. With the low impedance path blocked and the high impedance path allowing current flow, a limited current will be allowed to flow through any fuse for which a blow signal is asserted. Actuating transistor Q3 connects rail voltage Vpp to the fuse supply Vfuse through a relatively high resistance resistor R0, as noted above. For example, the resistor R0 may have a resistance of approximately 4 kiloohms. The rail voltage Vpp and resistor R0 are configured to limit current in the high impedance path to a very low amplitude test current signal that flows through the fuse supply Vfuse (assuming the blow signal assertion circuitry operates properly and the fuse 12 is not blown).

As FIG. 1 most simply shows, this small current will not flow through the fuse 12 unless the blow transistor Q1 completes its circuit. The blow transistor Q1 must be activated by a blow signal to substitute a low impedance for the high impedance it presents to the circuit when it is not activated. Accordingly, during the test mode, a blow signal also is applied to permit this test current to pass through the fuse 12. As noted above, this current has a sufficiently low amplitude that does not blow/rupture the fuse 12.

Returning to FIG. 4, this low current should cause a large voltage across resistor R0, and a smaller voltage across the fuse 12. This low resistance presented to the supply Vfuse from the blow transistor Q1 and unblown fuse 12 (to ground) pulls the supply Vfuse to ground. Accordingly, when this happens, the fuse supply Vfuse is considered to have a logical low output signal, indicating that the fuse 12 is not blown and the blow signal assertion circuitry is operating properly. To detect this signal, the fuse tester 18 has an output circuit connected to the fuse supply Vfuse. In the embodiment of FIG. 4, the output circuit is an inverter circuit, shown schematically as having transistors Q4 and Q5. The inverter circuit has a test output, identified as "Vfuse_low," which has a logical level that is opposite to that of the fuse supply Vfuse. In this example, the test output Vfuse_low delivers a logical high signal, indicating that the blow signal assertion circuitry is functioning properly and the fuse 12 is not blown. Accordingly, in this embodiment, downstream circuitry can read the test output Vfuse_low to determine if the fuse 12 is blown, or the blow signal assertion circuitry is operating properly.

The above discussion assumes that the fuse 12 is not blown and the blow circuitry 16 is operating properly. If the fuse 12 has been blown, then minimal current flows through it and resistor R0, causing fuse supply Vfuse to be read as a logical high. In a similar manner, if the blow transistor Q1 or the circuitry leading up to it is defective and the blow signal thus fails to substitute a low impedance for the high impedance in series with the fuse, then minimal current flows through resistor R0, also causing Vfuse to be read as a logical high. The fuse supply Vfuse thus has a high-voltage controlled by rail voltage Vpp and, accordingly, delivers a logical high signal. Consequently, the test output Vfuse_low delivers a logical low signal, indicating that the fuse 12 is blown and/or the blow signal assertion circuitry is not functioning properly. If the blow transistor Q1 is defective in such a manner that it constantly shorts the fuse to ground, then the fuse will be blown whenever it is connected to the rail voltage Vpp through the low impedance path and thus the defect will be detected by detecting the blown fuse.

It should be noted that the figures show additional components not necessary for implementation of various embodiments. For example, if neither the "on" nor "test_on" signals are asserted, then rail voltage Vpp is disconnected. If "pwr_off" and "test_off" are then asserted, additional transistors Q6 and Q7 would pull the fuse supply Vfuse to voltage Vss in that case. Q6 and Q7 thus act as a logic gate tying the fuse supply voltage Vfuse to ground (the low voltage Vss) when neither "pwr_off" and "test_off" are asserted. In other words, when the switch Q2 in the low impedance path and switch Q3 in the high impedance path are both preventing current flow, the logic gate formed by Q6 and Q7 can be made to pull Vfuse down to Vss.

The high impedance path through the switch Q3 and resistor R0 and the low impedance path through switch Q2 are connected in parallel between the rail voltage Vpp and the fuse supply Vfuse. During testing the high impedance path will be substituted for the low impedance path, thus restricting testing to conditions in which the current through the fuse is limited to an amount below the threshold current. Illustrative embodiments therefore favorably permit testing of the fuse 12 and its corresponding circuitry without blowing/rupturing/setting the fuse 12.

Although the above discussion discloses various exemplary embodiments of the invention, it should be apparent that those skilled in the art can make various modifications that will achieve some of the advantages of the invention without departing from the true scope of the invention.

What is claimed is:

1. A method of testing one-time-programmable memory, the method comprising:
    limiting current through a one-time-programmable memory to a low amplitude signal, the one-time-programmable memory having a fuse configured to blow upon receipt of a signal having a threshold amplitude, the low amplitude signal being less than the threshold amplitude;
    using blow signal assertion circuitry to attempt to assert a blow signal to the fuse, the blow signal assertion circuitry, when not defective, also configured to permit the low amplitude signal to flow through the fuse when the fuse is not blown and the blow signal is asserted, the fuse not blowing in response to flow of the low amplitude signal through the fuse; and
    producing an output signal having a success value if the low amplitude signal flows through the fuse, the output having a failure value if the low amplitude signal does not flow through the fuse.

2. The method as defined by claim 1 wherein the low amplitude signal comprises a current signal.

3. The method as defined by claim 1 wherein the output signal has the failure value if the blow circuitry cannot assert the blow signal to the fuse.

4. The method as defined by claim 1 wherein the output signal has the failure value if the fuse is blown.

5. The method as defined by claim 1 wherein a voltage source is in series with the one-time-programmable memory and wherein the fuse is configured to blow if current through the one-time-programmable memory is not being subjected to said limiting and the blow signal assertion circuitry attempts to assert the blow signal when the blow signal assertion circuitry is not defective.

6. The method as defined by claim 1 wherein producing an output signal comprises detecting a voltage at a supply to the fuse.

7. A method of testing one-time-programmable memory, the method comprising:
  imposing a first high impedance between a voltage source and a one-time-programmable memory, the one-time-programmable memory having a fuse configured to blow upon receipt of a threshold current, the first high impedance limiting current flow through the fuse to less than the threshold current;
  asserting a blow signal to the one-time-programmable memory, wherein, when the blow signal assertion circuitry is not defective, the blow signal substitutes a low impedance for a second high impedance in series with the fuse;
  producing an output signal having a success value if current flows through the fuse, the output having a failure value if current does not flow through the fuse.

8. The method as defined by claim 7 wherein the fuse is configured to blow upon connection to the voltage source if the first high impedance is not imposed and the low impedance is substituted for the second high impedance in series with the fuse.

9. The method as defined by claim 7 wherein the output signal has the failure value if the blow signal fails to substitute the low impedance for the second high impedance.

10. The method as defined by claim 7 wherein the output signal has the failure value if the fuse is blown.

11. The method as defined by claim 7 wherein producing an output signal comprises detecting a voltage at a fuse supply to the fuse.

12. Testable nonvolatile memory system comprising:
  a fuse supply for connection to a fuse coupled to a blow transistor;
  a low impedance path connected to the fuse supply and capable of providing more than a threshold current to blow the fuse;
  a high impedance path connected to the fuse supply for providing a current limited to less than the threshold current;
  a switch in the low impedance path for allowing or preventing current flow in the low impedance path to the fuse supply; and
  blow signal assertion circuitry coupled to the blow transistor, said blow signal assertion circuitry and said fuse being testable, when the switch is preventing current flow in the low impedance path, by an attempt to assert a blow signal with the high impedance path providing the current.

13. The nonvolatile memory system as defined by claim 12 further comprising a switch in the high impedance path, the switch allowing current to flow in the high impedance path for testing the fuse.

14. The nonvolatile memory system as defined by claim 13 further comprising a logic gate connected to the fuse supply for tying the fuse supply to ground when the switch in the high impedance path and the switch in the low impedance path are both preventing current flow.

15. The nonvolatile memory system as defined by claim 12 further comprising a rail voltage and wherein the low impedance path and the high impedance path are connected in parallel between the rail voltage and the fuse supply.

16. The nonvolatile memory system as defined by claim 12 further comprising an output circuit connected to the fuse supply for providing an output signal, wherein during testing with current flowing through the high impedance path the output signal has a success value if current flows through the fuse and has a failure value if current does not flow through the fuse.

17. The nonvolatile memory system as defined by claim 16 wherein the output circuit is an inverter.

* * * * *